United States Patent
Sloan et al.

(10) Patent No.: US 6,321,437 B1
(45) Date of Patent: Nov. 27, 2001

(54) MULTIPLE NUT DRIVER FOR COMPUTER ASSEMBLY

(75) Inventors: Robert Sloan, Round Rock; Michael Tuohy, Austin, both of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/568,431

(22) Filed: May 10, 2000

Related U.S. Application Data

(62) Division of application No. 09/236,992, filed on Jan. 26, 1999, now Pat. No. 6,189,418.

(51) Int. Cl.[7] ........................................... B23P 11/00
(52) U.S. Cl. ..................... 29/525.01; 29/407.1; 29/464; 81/57.36
(58) Field of Search ................. 29/407.09, 407.1, 29/464, 525.01, 525.11; 81/57.36, 57.22, 57.24, 57.32, 57.4, 429

(56) References Cited

U.S. PATENT DOCUMENTS

| | | | |
|---|---|---|---|
| 2,807,972 | * 10/1957 | Mitchell | 81/57.36 |
| 3,757,613 | * 9/1973 | Arndt et al. | 81/57.22 |
| 5,623,754 | * 4/1997 | Swann et al. | 29/464 |

\* cited by examiner

*Primary Examiner*—S. Thomas Hughes
*Assistant Examiner*—Jermie E. Cozart
(74) *Attorney, Agent, or Firm*—Haynes and Boone, L.L.P.

(57) ABSTRACT

An apparatus and method for attaching a processor bracket to a system board. The apparatus includes: a) a driver base, b) a plurality of air drivers secured to the driver base, c) a screwdriver rod, with a screwdriver head, extending from each air driver, and d) a positioning guide attached to the driver base. The method includes the steps of: a) positioning a processor bracket, having a processor bracket slot and having multiple bracket nuts, on a system board, b) positioning a positioning guide of a multiple nut driver within the processor bracket slot, c) contacting the bracket nuts with the corresponding screwdriver heads of the multiple nut driver, and d) exerting downward pressure on all the screwdriver heads.

6 Claims, 3 Drawing Sheets

MULTIPLE NUT DRIVER FOR COMPUTER ASSEMBLY

This application is a divisional of application Ser. No. 09/236,992 filed Jan. 26, 1999 now U.S. Pat. No. 6,189,418.

TECHNICAL FIELD

The disclosures herein relate to the field of computer assembly tools, and, more particularly, to tools for attaching a processor bracket to a system board.

BACKGROUND

Previously, assemblers used screwdrivers ("single head screw tools") to install processor brackets on system boards. An assembler would use the single head screw tool to install the processor bracket by individually attaching each bracket nut with the tool. This method often damaged the system board, and was time consuming because the assembler had to position the processor bracket, and individually install each bracket nut. Additionally, assemblers were often hesitant about using single head screw tools to install processor brackets because of the manual skills needed to operate the tools. Accordingly, what is needed is an apparatus and a methodology for easily installing a processor bracket on a system board that permits the simultaneous installation of a plurality of bracket nuts, and does not damage the system board during the installation process.

SUMMARY

The present embodiments include an apparatus and a method for attaching a processor bracket to a system board. The apparatus includes: a) a driver base, b) a plurality of air drivers secured to the driver base, c) a screwdriver rod, with a screwdriver head, extending from each air driver, and d) a positioning guide attached to the driver base. The method includes the steps of: a) positioning a processor bracket, having a processor bracket slot and having multiple bracket nuts, on a system board, b) positioning a positioning guide of a multiple nut driver within the processor bracket slot, c) contacting the bracket nuts with the corresponding screwdriver heads of the multiple nut driver, and d) exerting downward pressure on all the screwdriver heads.

DETAILED DESCRIPTION OF THE PREFERRED EMBODIMENT

Figure 1:
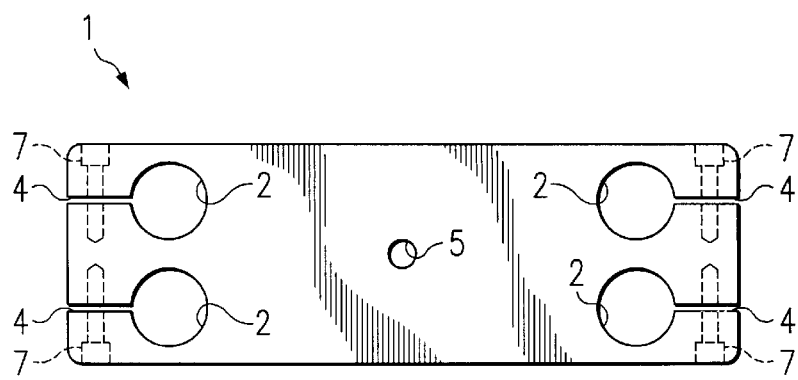
FIG. 1 is a bottom view of a driver base.
Figure 2:
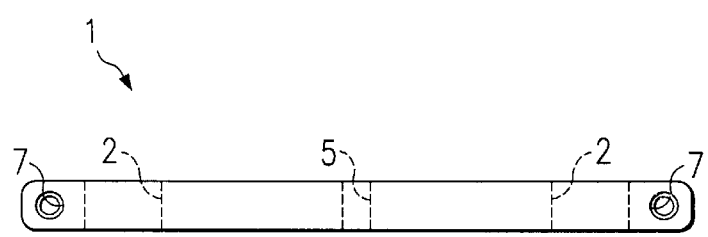
FIG. 2 is a side view of a driver base.
Figure 6:
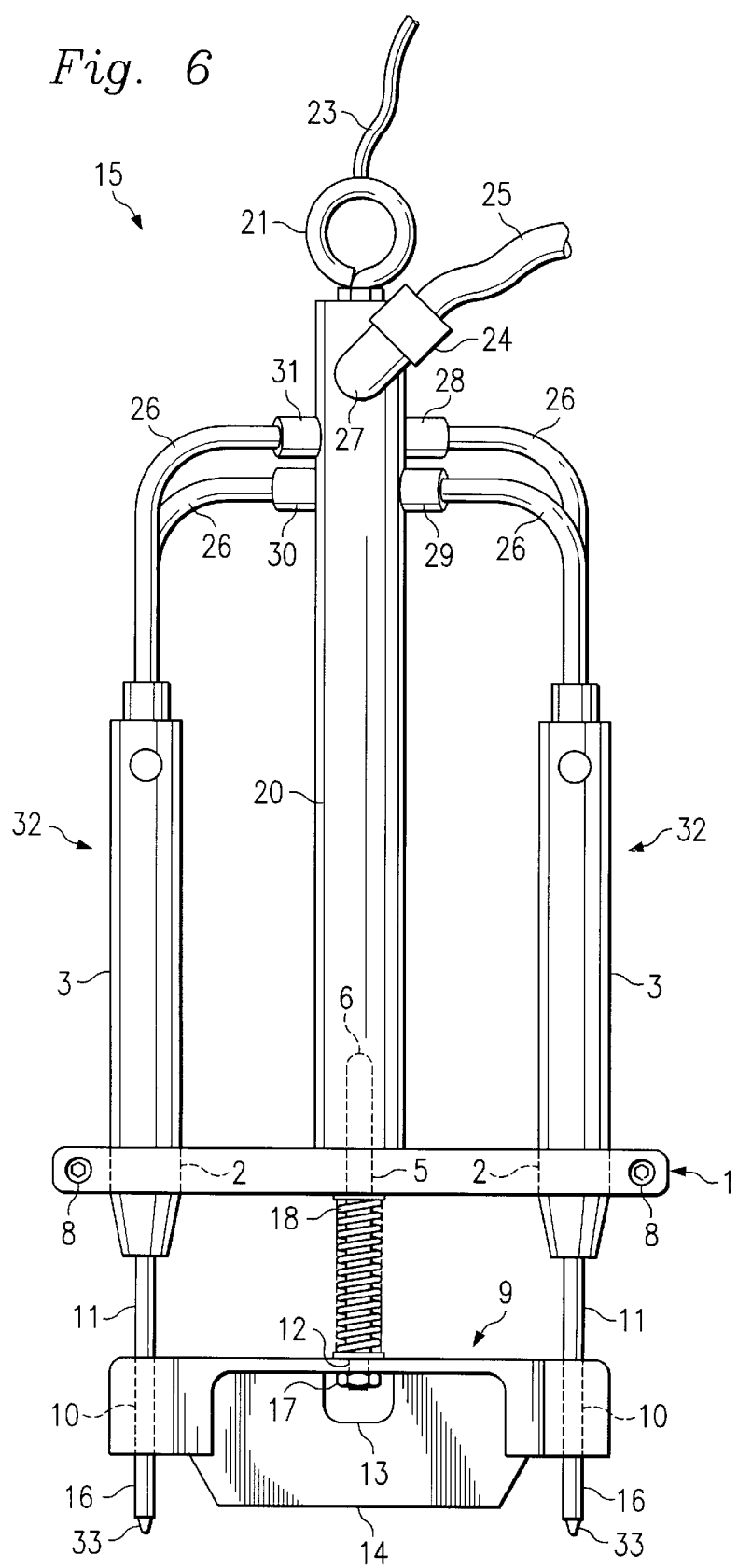
FIG. 6 is a side view of a preferred embodiment.

Referring to FIG. 1 and FIG. 2, a driver base 1 includes four circular air driver channels 2 that extend vertically through the thickness of the driver base 1. The circumference of the air driver channels 2 approximately corresponds to the circumference of an air driver 3 (FIG. 6). The air driver channels 2 include a closeable gap 4 that extends through the thickness of the driver base 1. The driver base 1 also includes a circular base connecting rod channel 5, located near the center of the driver base 1, that extends vertically through the thickness of the driver base 1. The circumference of the base connecting rod channel 5 approximately corresponds to the circumference of a connecting rod 6 (FIG. 6). The driver base 1 further includes four screw channels 7 that extend through the closeable gaps 4. Installation of a screw 8 (FIG. 6) within the screw channel 7 reduces the size of the closeable gap 4.

Figure 3:
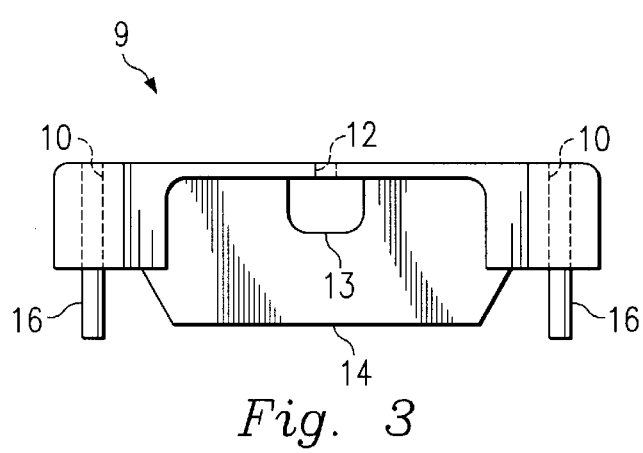
FIG. 3 is a side view of a positioning guide.
Figure 4:
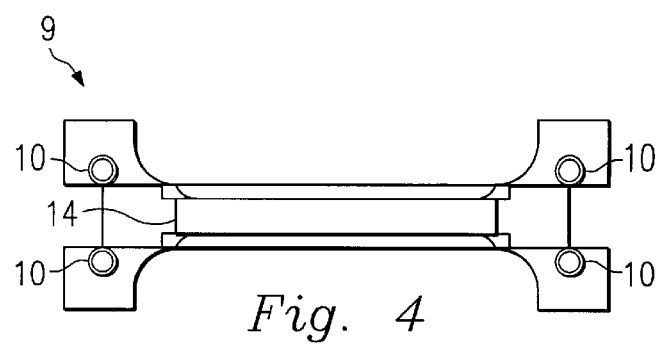
FIG. 4 is a bottom view of a positioning guide.

Referring to FIG. 3 and FIG. 4, a positioning guide 9 includes four circular screwdriver rod channels 10 that extend vertically through the thickness of the positioning guide 9. The circumference of the screwdriver rod channels 10 approximately corresponds to the circumference of a screwdriver rod 11 (FIG. 6). The positioning guide 9 also contains a circular guide connecting rod channel 12. The circumference of the guide connecting rod channel 12 approximately corresponds to the circumference of the connecting rod 6 (FIG. 6). The positioning guide 9 further contains a screw depth opening 13 that extends from the top surface of the positioning guide 9. The shape of a lower guide portion 14 of the positioning guide 9 approximately corresponds to the shape of a processor bracket slot (not illustrated). The lower guide portion 14 assists an assembler in positioning a multiple nut driver 15 (FIG. 6) correctly over a processor bracket (not illustrated), for attaching the processor bracket to a system board (not illustrated). The positioning guide 9 additionally contains four tubular extension guides 16 that extend downward from the lower edge of the screwdriver rod channels 10. The circumference of the extension guides 16 approximately corresponds to the circumference of the screwdriver rod 11. The extension guides 16 also assist the assembler in positioning the multiple nut driver 15 over a processor bracket, for attaching the processor bracket to a system board.

Figure 5:
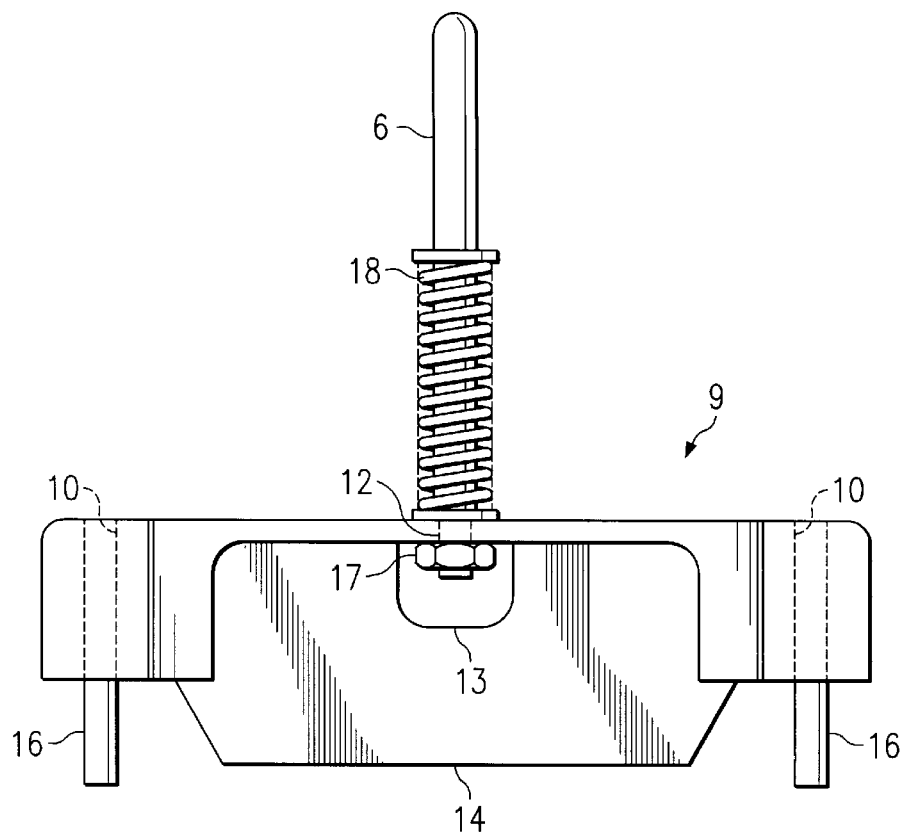
FIG. 5 is a side view of a positioning guide with a connecting rod.

Referring to FIG. 5, the connecting rod 6 extends through the guide connecting rod channel 12, and a rod nut 17 secures the connecting rod 6 to the positioning guide 9. A compression spring 18 encases a portion of the connecting rod 6. The distance between the bottom of the rod nut 17 and the bottom of the screw depth opening 13 precisely corresponds to the driving distance required to install a bracket nut. The screw depth opening 13 prevents an assembler from overdriving the bracket nut, by restricting the screw depth distance.

Referring to FIG. 6, the multiple nut driver 15 includes a cylindrical handle 20 that can be grasped by an assembler to maneuver and operate the multiple nut driver 15.

An eyebolt 21 connects to the top of the handle 20, and functions as an attachment site for a tension pulley 23. The tension pulley 23 attaches to the eyebolt 21 of the multiple nut driver 15, and suspends the multiple nut driver 15 above the assembler's work station. Suspension of the multiple nut driver 15 allows the assembler to easily operate the multiple nut driver 15.

An intake elbow 24 connects to the upper portion of the handle 20, and functions as an inlet for air. An air hose 25 supplies air to the multiple nut driver 15. Lengths of tubing 26 connect to the handle 20 at tubing connection sites 28, 29, 30, and 31, slightly below the intake elbow connection site 27. The lengths of tubing 26 extend outwardly from tubing connection sites 28, 29, 30, and 31 on the handle 20, and connect to the top of corresponding air drivers 3. The tubing 26 directs air flow to corresponding air drivers 3.

An air screwdriver 32 consists of the commercially available air driver 3 (part number 2RSA-10SB, manufactured by Cleco of Houston, Tex.) and the screwdriver rod 11, with a screwdriver head 33. The air drivers 3 extend through corresponding air driver channels 2 in the driver base 1. The air drivers 3 remain statically positioned within the driver base 1 upon installation of the screws 8 within the screw channels 7 (FIG. 1) of the driver base 1. The screwdriver rods 11 of the air screwdrivers 32 extend through corresponding screwdriver rod channels 10 and extension guides 16 on the positioning guide 9.

The connecting rod 6 connects the positioning guide 9 to the driver base 1. The rod nut 17 secures the connecting rod 6 to the positioning guide 9. The connecting rod 6 extends through the base connecting rod channel 5 on the driver base 1. The top portion of the connecting rod 6 extends into the inner portion of the handle 20. The compression spring 18 encases the portion of the connecting rod 6 extending between the bottom of the driver base 1 and the top of the positioning guide 9. The tension of the compression spring 18 requires the assembler to exert some small degree of pressure in order to operate the multiple nut driver 15.

Figure 7:
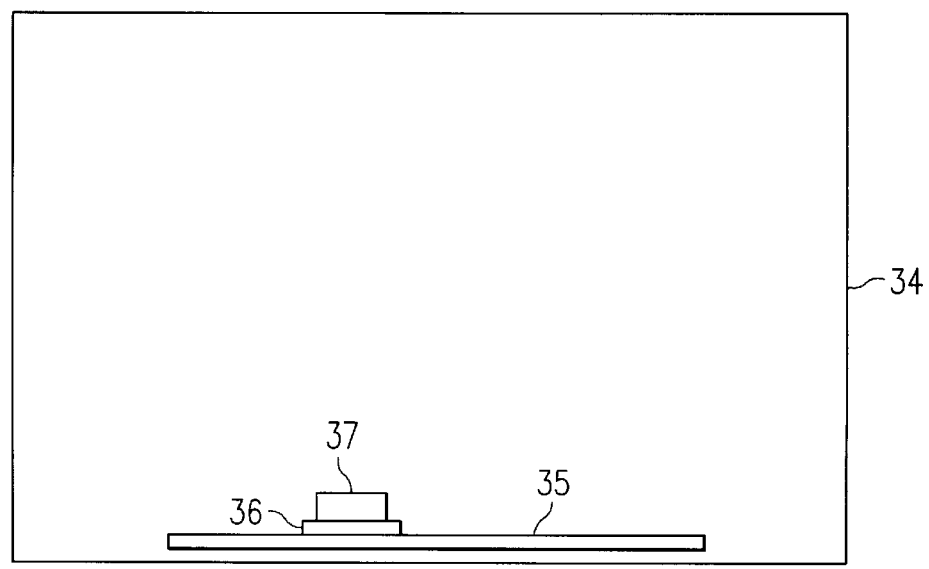
FIG. 7 is a block diagram depicting a computer.

In practice, the assembler positions a processor bracket 36 (FIG. 7), (not shown) with multiple encapsulated bracket nuts (not illustrated), on a system board 35 (FIG. 7). The assembler then places the positioning guide 9 of the multiple nut driver 15 within the processor bracket slot of the processor bracket, and contacts each screwdriver head 33 with a corresponding bracket nut. Holding the handle 20, the assembler pushes down on the multiple nut driver 15. Simultaneous pressure on all the screwdriver heads 33 triggers the flow of air to the air drivers 3. The requirement that pressure be exerted on all the screwdriver heads 33 before air flow begins ensures that the assembler has contacted all the screwdriver heads 33 to corresponding bracket nuts before the screwdriver rods 11 begin to rotate. Air flow to the air drivers 3 causes the screwdriver rods 11 to rotate. The rotating screwdriver rods 11 simultaneously screw on the plurality of bracket nuts. The use of four separately powered air drivers 3 permits compensation for slight differences in each bracket nut. As the assembler exerts pressure and the multiple nut driver 15 installs the bracket nuts, the positioning guide 9 slides upward along the axis of the screwdriver rods 11 until the bottom of the rod nut 17 contacts the bottom of the screw depth opening 13. After each screwdriver rod 11 stops rotating, the assembler withdraws the multiple nut driver 15 from contacting the processor bracket.

Referring to FIG. 7, there is illustrated a computer 34, having a system board 35, a processor bracket 36, and a processor 37. The assembler attaches the processor bracket 36 to the system board 35 using the multiple nut driver 15 of the present invention. After installation of the processor bracket 36 on the system board 35, the assembler inserts the processor 37 into the processor bracket 36. In an example embodiment, the processor 37 consists of a Pentium II processor. Following assembly of the processor bracket 36 and the processor 37 on the system board 35, the assembler installs the system board 35 in the computer 34.

Although illustrative embodiments have been shown and described, a wide range of modification, changes and substitution is contemplated in the foregoing disclosure. In some instances, some features of the embodiments may be employed without a corresponding use of the other features. Accordingly, it is appropriate that the appended claims be construed broadly and in a manner consistent with the scope of the embodiments disclosed herein.

What is claimed is:

1. A method for installing a processor bracket on a system board, the method comprising the steps of:
   a. positioning a processor bracket, having a processor bracket slot and having multiple encapsulated bracket nuts, on the system board;
   b. positioning a positioning guide of a multiple nut driver within the processor bracket slot;
   c. contacting the bracket nuts with screwdriver heads of the multiple nut driver; and
   d. exerting downward pressure on all the screwdriver heads.

2. The method of claim 1, further comprising, after the step of exerting downward pressure on all the screwdriver heads, the step of simultaneously installing the plurality of bracket nuts.

3. The method of claim 1, further comprising, after the step of exerting downward pressure on all the screwdriver heads, the step of simultaneously installing four bracket nuts.

4. A method for installing a processor bracket on a system board, the method comprising the steps of:
   a. positioning a processor bracket, having a processor bracket slot and having multiple encapsulated bracket nuts, on the system board;
   b. positioning a positioning guide of a multiple nut driver within the processor bracket slot;
   c. contacting the bracket nuts with screwdriver heads of the multiple nut driver; and
   d. exerting downward pressure on all the screwdriver heads until the bottom of a rod nut of the multiple nut driver contacts the bottom of a screw depth opening of the multiple nut driver.

5. The method of claim 4, further comprising, after the step of exerting downward pressure on all the screwdriver heads until the bottom of a rod nut of the multiple nut driver contacts the bottom of a screw depth opening of the multiple nut driver, the step of simultaneously installing the plurality of bracket nuts.

6. The method of claim 4, further comprising, after the step of exerting downward pressure on all the screwdriver heads until the bottom of a rod nut of the multiple nut driver contacts the bottom of a screw depth opening of the multiple nut driver, the step of simultaneously installing four bracket nuts.

* * * * *